US007923809B2

(12) United States Patent
Onda et al.

(10) Patent No.: US 7,923,809 B2
(45) Date of Patent: Apr. 12, 2011

(54) SEMICONDUCTOR DEVICE HAVING SHIELD STRUCTURE

(75) Inventors: Takamitsu Onda, Chuo-ku (JP); Kazuhiko Matsuki, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 76 days.

(21) Appl. No.: 12/407,250

(22) Filed: Mar. 19, 2009

(65) Prior Publication Data

US 2009/0237186 A1 Sep. 24, 2009

(30) Foreign Application Priority Data

Mar. 21, 2008 (JP) ................................ 2008-074699

(51) Int. Cl.
*H01L 29/06* (2006.01)

(52) U.S. Cl. ................................ 257/508; 257/E21.546

(58) Field of Classification Search .................. 257/294, 257/324, 340, 409, 508, 758, E21.546
See application file for complete search history.

(56) References Cited

U.S. PATENT DOCUMENTS

| | | | | |
|---|---|---|---|---|
| 7,550,850 | B2 * | 6/2009 | Nakashiba | 257/758 |
| 7,667,279 | B2 * | 2/2010 | Nakashiba | 257/409 |
| 2004/0150070 | A1 * | 8/2004 | Okada et al. | 257/508 |
| 2007/0057280 | A1 * | 3/2007 | Hayashi et al. | 257/127 |
| 2008/0129911 | A1 * | 6/2008 | Huang et al. | 349/44 |
| 2008/0237747 | A1 * | 10/2008 | Hayashi et al. | 257/409 |
| 2009/0160012 | A1 * | 6/2009 | Kim | 257/508 |
| 2009/0206392 | A1 * | 8/2009 | Shin et al. | 257/324 |
| 2009/0296477 | A1 * | 12/2009 | Kim et al. | 365/185.17 |
| 2010/0182078 | A1 * | 7/2010 | Cantoni | 327/581 |

FOREIGN PATENT DOCUMENTS

JP 2000-353785 A 12/2000

* cited by examiner

*Primary Examiner* — Nathan W Ha
(74) *Attorney, Agent, or Firm* — Sughrue Mion, PLLC

(57) ABSTRACT

A semiconductor device comprises a semiconductor substrate; a diffusion layer formed on the semiconductor substrate; at least two wiring layers formed opposite to each other over the semiconductor substrate; signal lines for transmitting a signal maintaining a predetermined voltage, each of the signal lines being formed in each of the two wiring layers; shield lines fixed to a constant voltage to shield the signal lines, each of the shield lines being formed adjacent to each of the signal lines in the two wiring layers; and a gate electrode formed over the semiconductor substrate via an insulation film. In the semiconductor device, at least one of the signal lines formed in a lower wiring layer of the at least two wiring layers is electrically connected to the gate electrode opposed in a stacking direction.

15 Claims, 7 Drawing Sheets

SEMICONDUCTOR DEVICE HAVING SHIELD STRUCTURE

BACKGROUND OF THE INVENTION

1. Field of the Invention

The present invention relates to a semiconductor device having signal lines for a reference signal supplied to an internal circuit, and particularly relates to a semiconductor device having a shield structure for shielding the signal lines for the reference signal from noise and the like.

2. Description of Related Art

Generally, a reference signal is used in a semiconductor device in order to supply a reference voltage to internal circuits. The voltage value of the reference signal is required to be stable with a small fluctuation. It is desirable to design the semiconductor device having a structure in which signal lines for transmitting the reference signal are hardly affected by other adjacent signal lines. A semiconductor device has been conventionally proposed in which a shield structure surrounding the signal lines for the reference signal is formed so as to shield the lines from the noise affected by other lines (for example, see Laid-open Japanese Patent Publication No. 2000-353785).

FIG. 7 shows a cross-sectional view indicating a shield structure for a reference signal in a conventional semiconductor device 100. In the semiconductor device 100 shown in FIG. 7, an interlayer insulation film 102 is formed on a semiconductor substrate 101, and three wiring layers M1, M2 and M3 are stacked over the semiconductor substrate 101 from lower to upper. In addition, interlayer insulation films are formed between the respective wiring layers M1 to M3. A plurality of signal lines 103 for the reference signal is formed in the uppermost wiring layer M3. Further, a plurality of shield lines 104 adjacent to the signal lines 103 is formed in the same wiring layer M3. In the example of FIG. 7, three of the signal lines 103 for the reference signal and four of the shield lines 104 are shown.

A conductor pattern is formed in the wiring layer M2 under the wiring layer M3 so as to cover an entire surface of the upper opposing signal lines 103 for the reference signal. The conductor pattern of the wiring layer M2 and the shield lines 104 of the uppermost wiring layer M3 are connected via contact plugs 105 in a stacking direction. The conductor pattern of the wiring layer M2 functions as a shield plate for shielding interference from wirings formed in the lower wiring layer M1. In this manner, the shield structure shown in FIG. 7 includes the signal lines 103 and the shield lines 104 which are alternately arranged in the same wiring layer M3 and includes the conductive pattern functioning as the shield plate formed in the lower wiring layer M2 for the purpose of electromagnetically shielding the signal lines 103 for the reference signal.

In the semiconductor device 100 of FIG. 7, two wiring layers M3 and M2 are required for forming the shield structure. However, only three signal lines 103 for the reference signal can be arranged within a range shown in FIG. 7, it is structurally difficult to arrange the signal lines 103 in a high density. In this manner, when forming the shield structure by arranging a large number of the shield lines 104 for the reference signal in the above conventional semiconductor device 100, there is a problem that it is difficult to achieve an effective arrangement since multiple layers and a wide wiring area are required. In recent semiconductor devices, the chip size is determined by a restriction of an occupied area of the wiring area rather than restrictions of areas of elements such as transistors and the like, and therefore this has become a cause of hindering a reduction in chip size.

SUMMARY

The present invention seeks to solve the above problems and provides a semiconductor device with a shield structure for signal lines requiring stability of voltage, in which the signal lines are densely arranged using at lest two wiring layers facing to each other, so as to achieve the shield structure suppressing the effect of noise to the signal lines reliably with a small chip area.

In one of aspects of the invention, there is provided a semiconductor device comprising: a semiconductor substrate; a diffusion layer formed on the semiconductor substrate; at least two wiring layers formed opposite to each other over the semiconductor substrate; signal lines for transmitting a signal maintaining a predetermined voltage, each of the signal lines being formed in each of the two wiring layers; shield lines fixed to a constant voltage to shield the signal lines, each of the shield lines being formed adjacent to each of the signal lines in the two wiring layers; and a gate electrode formed over the semiconductor substrate via an insulation film, wherein at least one of the signal lines formed in a lower wiring layer of the at least two wiring layers is electrically connected to the gate electrode opposed in a stacking direction.

According to the aspects of the invention, in the two wiring layers opposed to each other, the signal lines to be stabilized at a predetermined voltage are formed and also the shield lines adjacent to the signal lines are formed. The signal line in the lower layer is electrically connected to the gate electrode opposed in the stacking direction. Thus, the signal line in the upper layer is shielded by the shield line arranged in the same layer or in the lower layer, and the signal line in the lower layer is connected to the gate electrode forming a capacitor with the semiconductor substrate via an insulation film so that its potential is stabilized by the effect of the capacitor. Accordingly, the potential of each of the signal lines can be stabilized since the effects of the shield lines and the capacitor prevent them from being affected by noise of other wirings or the like, and an occupied area can be decreased by densely arranging the signal lines.

In the present invention, the signal line may be a reference signal for supplying a reference voltage to an internal circuit. Also the shield lines may be electrically connected to the diffusion layer opposed in the stacking direction. In addition, the diffusion layer may be formed on an N-type well which is formed on the semiconductor substrate and is opposed to the gate electrode.

As described above, according to the present invention, the signal lines for transmitting a signal to be stabilized at a predetermined voltage are formed so that a shield structure is employed where the shield lines are adjacent to the signal lines in the two wring layers and the signal line in the lower wiring layer is connected to the gate electrode opposed in the stacking direction. Thus, the signal line in the lower wiring layer is connected to the gate electrode to function as a capacitor in addition to the shielding effect of the shield lines. Since interference from signal lines and the like formed in other wiring layers is suppressed by the shield lines and the above capacitor, so that the potential of the signal lines can be reliably stabilized. Although the signal lines are formed only in the upper wiring layer in the conventional shield structure, the signal lines of the present invention can be formed in the two wiring layers. Therefore, the signal lines can be densely arranged, thereby reducing the chip size of the semiconductor device due to a decrease in a layout area.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, three embodiments of a semiconductor device to which the present invention is applied will be described.

First Embodiment

Figure 1:
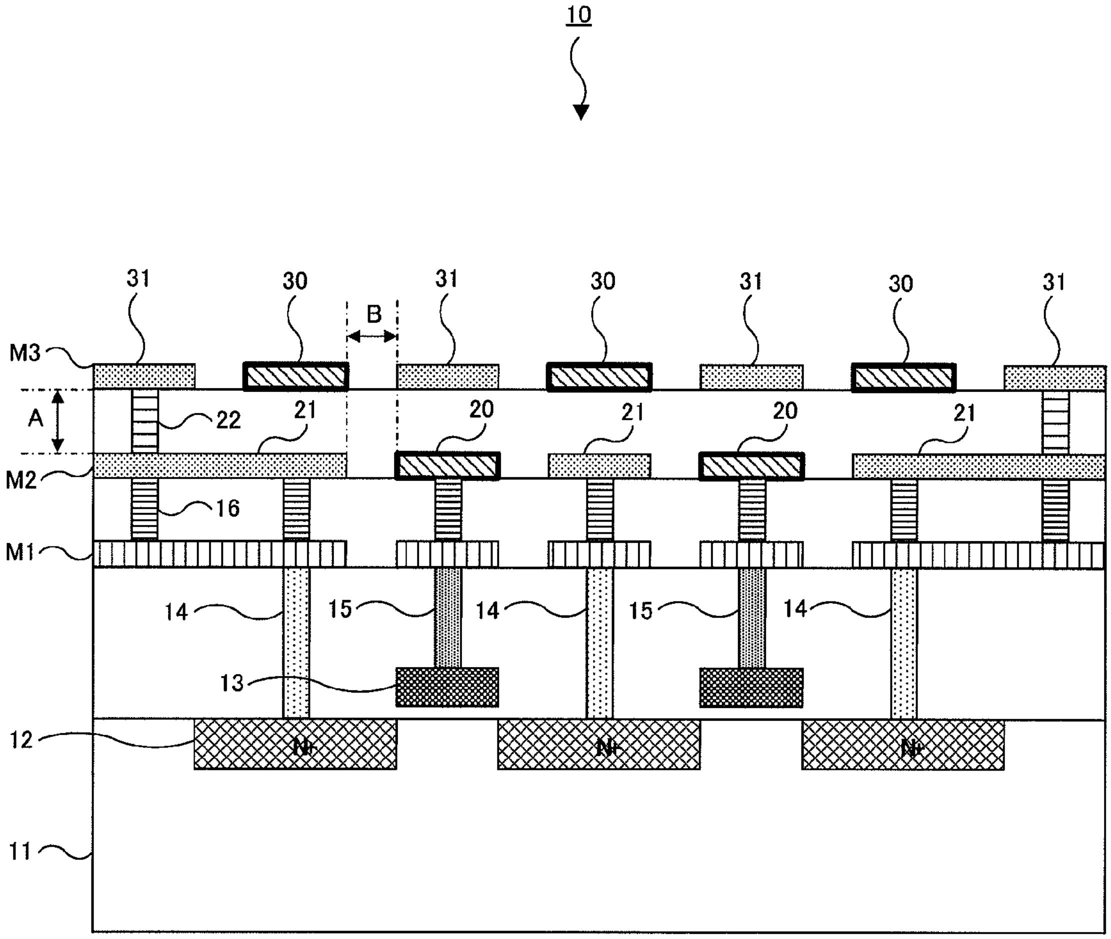
FIG. 1 is a cross-sectional view of a semiconductor device of a first embodiment.
Figure 2:
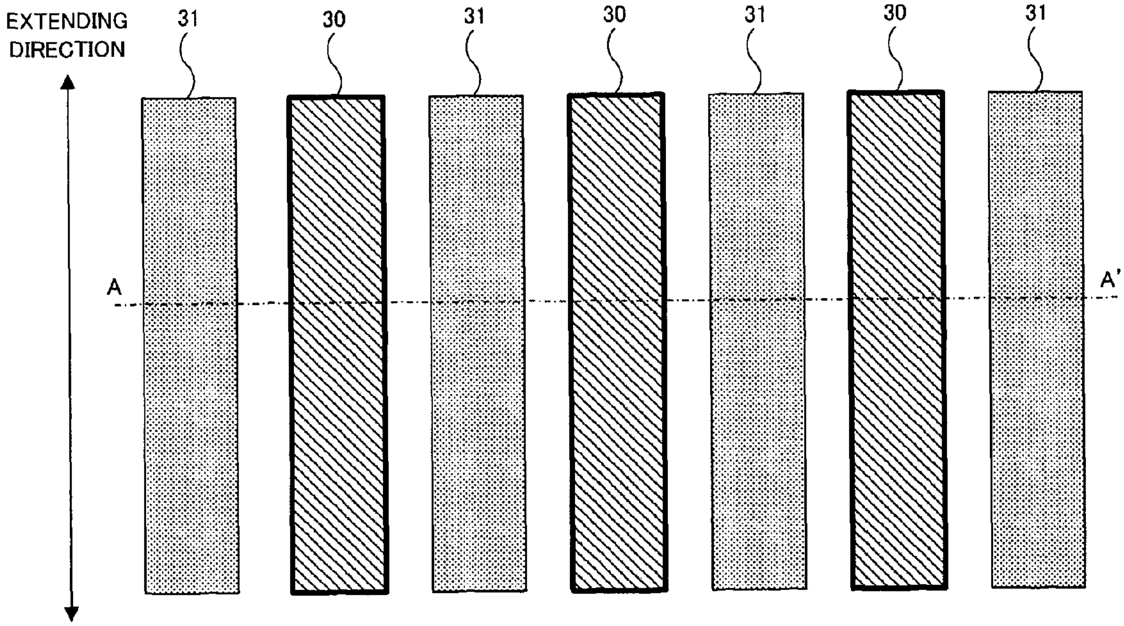
FIG. 2 is a plane view showing only an uppermost wiring layer M3 in the semiconductor device of FIG. 1.

A semiconductor device of a first embodiment of the present invention will be described with reference to FIGS. 1 and 2. FIG. 1 shows a cross-sectional view of a semiconductor device 10 of the first embodiment. FIG. 2 is a plane view showing only an uppermost wiring layer M3 in the semiconductor device 10 of FIG. 1, and a cross section along A-A' line in FIG. 2 corresponds to FIG. 1. In FIG. 2, respective lines are assumed to be arranged so as to extend in a direction of arrows.

As shown in FIG. 1, in the semiconductor device 10 of the first embodiment, N-type diffusion layers 12 are formed on a semiconductor substrate 11 made of P-type silicon. Gate electrodes 13 are formed over channels between the N-type diffusion layers 12. Gate insulating films are formed using silicon dioxide films (SiO2) between the gate electrodes 13 and the semiconductor substrate 11. Each N-type diffusion layer 12 and each gate electrodes 13 form a MOS structure in the semiconductor device 10.

Three wiring layers M1, M2 and M3 using metal wirings are formed in upper portions of the semiconductor device 10. The wiring layer M1, the wiring layer M2 and the uppermost wiring layer M3 are stacked from lower to upper. Interlayer insulation films using silicon dioxide films are formed between the respective wiring layers M1 to M3. The above N-type diffusion layers 12 and the wiring layer M1 are connected via contact plugs 14 in a stacking direction, and the above gate electrodes 13 and the wiring layer M1 are connected via contact plugs 15 in the stacking direction.

There are formed three signal lines 30 for a reference signal and four shield lines 31 adjacent to the respective signal lines 30 in the uppermost wiring layer M3. The signal lines 30 and the shield lines 31 are alternately arranged. Further, there are formed two signal lines 20 for the reference signal and three shield lines 21 adjacent to the respective signal lines 20 in the wiring layer M2. The signal lines 20 and the shield lines 21 are alternately arranged. Here, the shield lines 21 of the wiring layer M2 are located under the signal lines 30 of the wiring layer M3, and the signal lines 20 of the wiring layer M2 are located under two shield lines 31 near the center of the wiring layer M3.

In both sides of FIG. 1, two shield lines 31 of the wiring layer M3 are connected to the shield lines 21 of the lower wiring layer M2 via the contact plugs 22 in the stacking direction. Further, the signal lines 20 and the shield lines 21 of the wiring layer M2 are connected to lines of the lower wiring layer M1 via contact plugs 16 in the stacking direction. Here, there are formed lines for other signals than the reference signal in the wiring layer M1.

The N-type diffusion layers 12 at both sides of the gate electrodes 13 are connected to the shield lines 21 and 31 of the wiring layers M2 and M3 based on the above connection relation, and connected to, for example, a constant voltage such as a ground potential VSS. In this case, each gate electrode 13 functions as one electrode of a capacitor formed between the semiconductor substrate 11 and the gate electrode 13.

An operation of the semiconductor device 10 of the first embodiment will be described. In FIG. 1, each signal line 30 for the reference signal, which is arranged in the wiring layer M3, is shielded by the shield lines 31 at its left and right sides, and is shielded by the shield line 21 of the wiring layer M2 at its lower side. Further, each signal line 20 for the reference signal, which is arranged in the wiring layer M2, is shielded by the shield lines 21 at its left and right sides, and is shielded by the shield line 31 of the wiring layer M3 at its upper side. Furthermore, each signal line 20 is connected to the gate electrode 13 via the contact plug 16, the line of the wiring layer M1, and the contact plug 15.

Here, the lower side of the signal lines 20 of the wiring layer M2 is not shielded, however, is connected to the gate electrodes 13 forming the capacitor on the semiconductor substrate 11. Such a structure has an effect to suppress voltage fluctuation of the signal lines 20 since capacitance component of the capacitor prevents it from being affected by noise even when the shield structure for shielding the lower side of the signal lines 20 is not formed.

By supplying the reference signal maintaining a predetermined voltage to the signal lines 20 functioning as the above electrode of the capacitor, the voltage of the signal lines 20 can be stabilized to a fixed level reliably. Therefore, the signal lines 20 of the wiring layer M2 do not cause the voltage fluctuation of the signal lines 30 of the wiring layer M3, and can be regarded to have the shield structure. Thus, the signal lines 30 of the wiring layer M3 enables to obtain the shielding effect equivalent to the conventional structure covered by a wide conductor pattern whose lower portion functions as a shield plate. Further, since the signal lines 20 of the wiring layer M2 have the structure to suppress the noise by being connected to the above capacitor at the lower side, they can be used as lines having the same function of stabilizing the signal level as the conventional shield structure.

Voltage levels of the signal lines 20 and the signal lines 30 may set to different voltage levels. In this case, two reference lines for different signal voltages are available.

Figure 7:
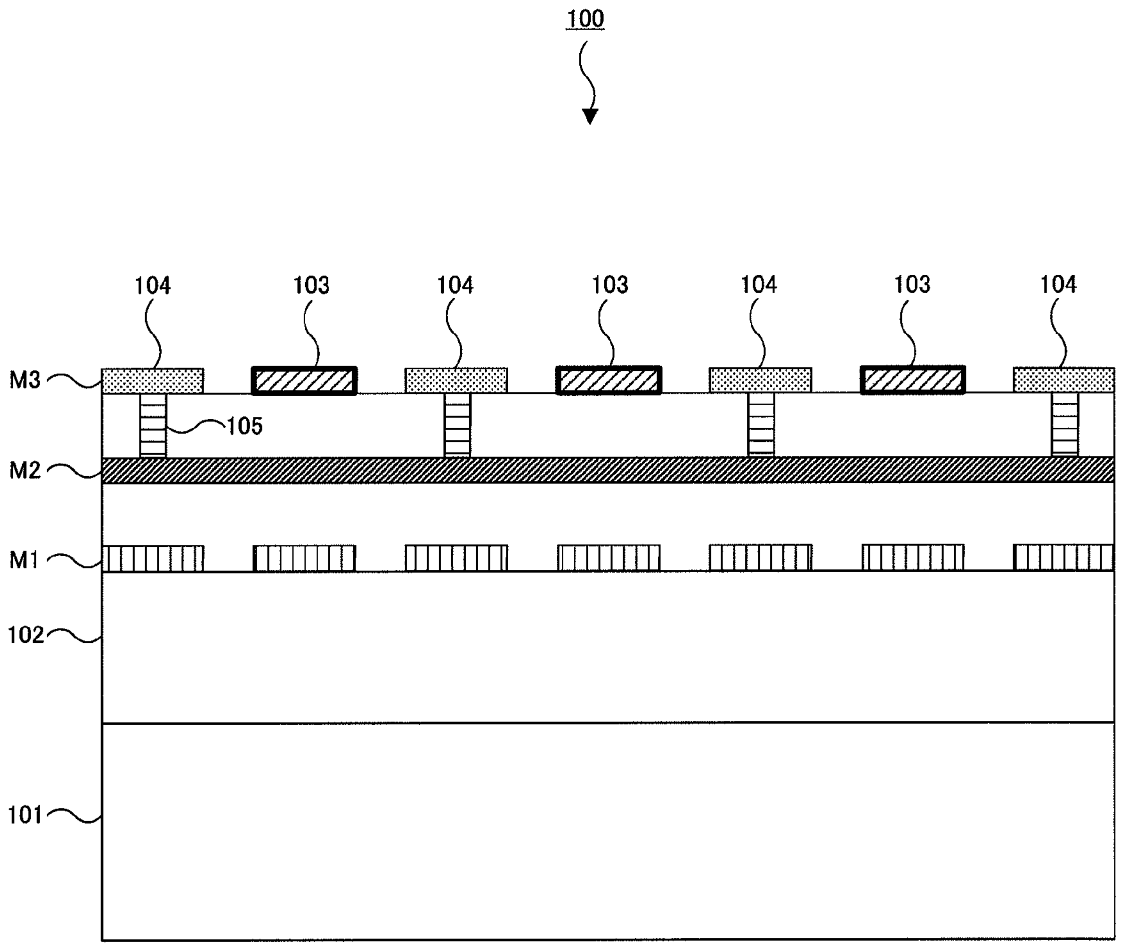
FIG.7 PRIOR ART
FIG. 7 is a cross-sectional view indicating a shield structure for a reference signal in a conventional semiconductor device.

As described above, in the semiconductor device 10 of the first embodiment, the lower wiring layer M2 has both functions of the signal lines 20 for the reference signal and the shield lines 21, as well as the uppermost wiring layer M3, thereby improving the arrangement density of the lines for the reference signal. That is, in the structure shown in FIG. 1, the signal lines 20 and 30 for the reference signal can be formed in the upper and lower wiring layers M2 and M3. Thus, while only the three signal lines 103 are arranged in the conventional structure of FIG. 7, on the assumption of the same wiring pitch, five signal lines 20 and 30 can be arranged in the structure of FIG. 1.

Here, attention will be focused on the distance between the signal lines 30 of the wiring layer M3 and the signal lines 20 of the wiring layer M2. As shown in FIG. 1, the wiring layer M3 and the wiring layer M2 are opposed to each other with a gap A in the stacking direction, while the signal lines 30 and the signal lines 20 are arranged with a distance B in a planar direction. In this case, calculating a distance D between the signal lines 30 and the signal lines 20 using the gap A and the distance B leads to $D=(a^2+b^2)^{1/2}$. Accordingly, if it is assumed that the signal lines 30 and the signal lines 20 are arranged in a positional relation vertically opposite to each other, the both lines are arranged with a distance A, while in the case of FIG. 1, they can be arranged with the distance D longer than the distance A. Thereby, if the signal level of the signal lines 20 for the reference signal slightly fluctuates, its affection to the upper signal lines 30 can be suppressed to minimum. Accordingly, the relative positional relation between the signal lines 30 and 20 for the reference signal is desired such that they are opposed to each other in a diagonally vertical direction as shown in FIG. 1 to avoid a directly vertical direction.

Figure 3:
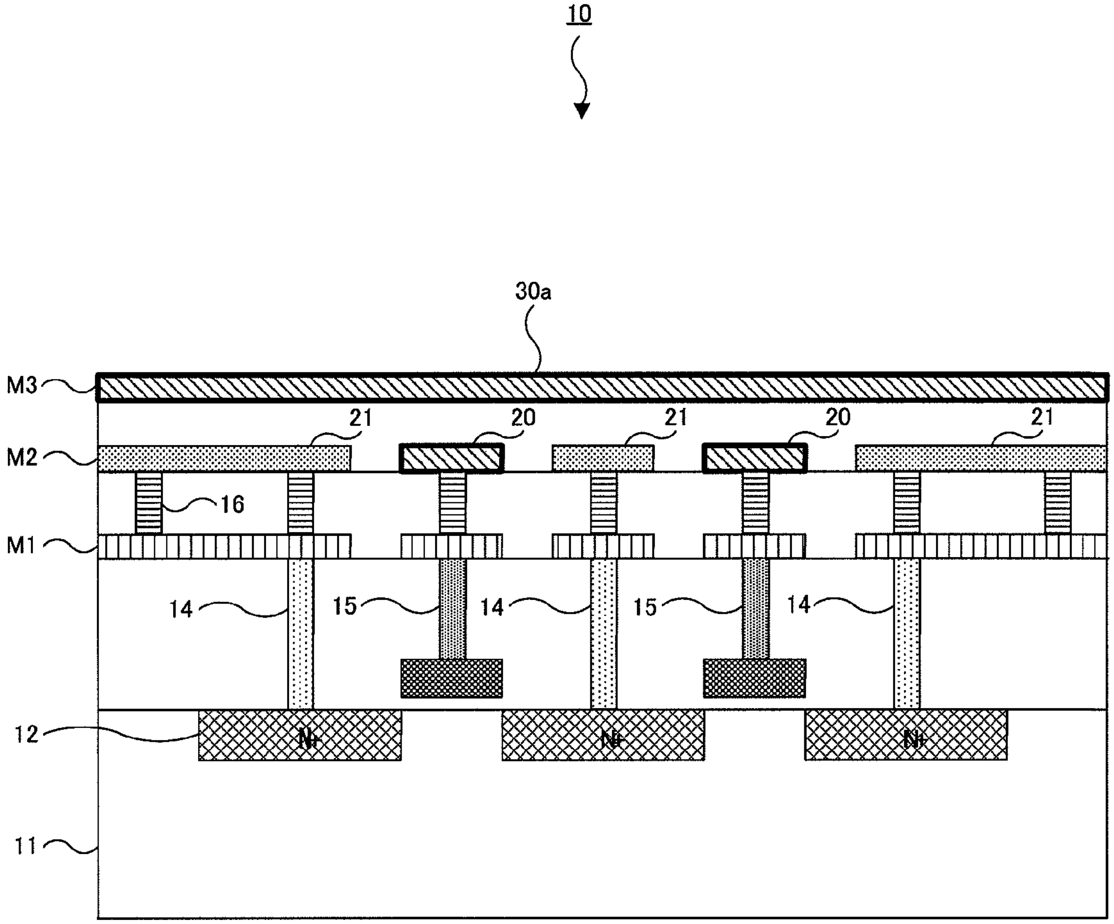
FIG. 3 is a cross-sectional view of a semiconductor device of a modification of the first embodiment.
Figure 4:
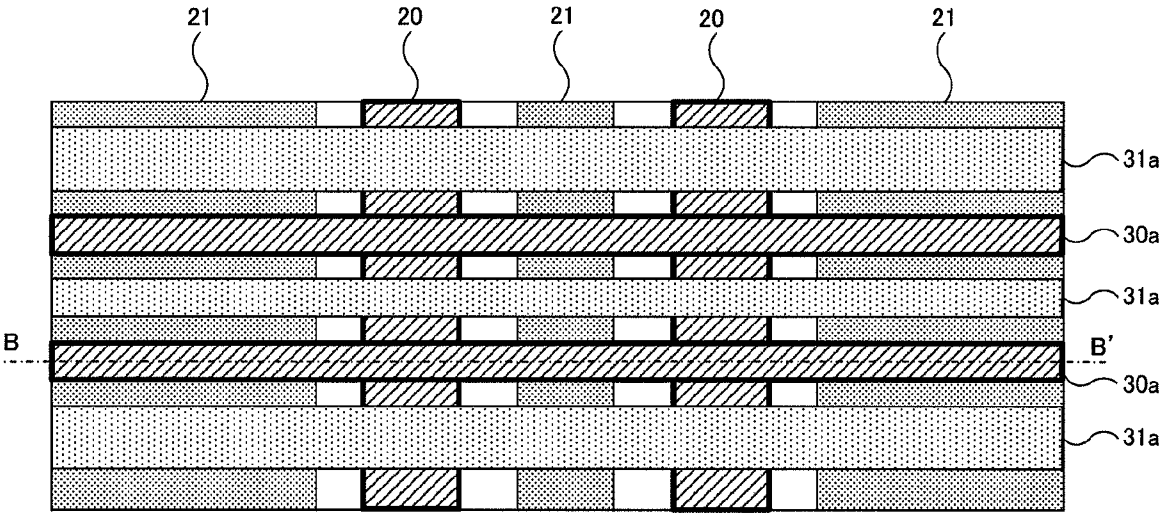
FIG. 4 is a plane view showing two wiring layers M2 and M3 of the semiconductor device of FIG. 3.

The structure of the semiconductor device 10 of the first embodiment can be properly modified according to the degree of stability required for the reference signal. In the following, a modification of the first embodiment will be described with reference to FIGS. 3 to 4. FIG. 3 is a cross-sectional view of a semiconductor device 10 of the modification. FIG. 4 is a plane view showing the two wiring layers M2 and M3 of the semiconductor device 10 of FIG. 3, and a cross section along B-B' line in FIG. 4 corresponds to FIG. 3.

In FIGS. 3 and 4, elements common to those in FIGS. 1 and 2 are represented by the same numbers and description thereof will be omitted. Meanwhile, FIGS. 3 and 4 differ from FIGS. 1 and 2 in that the extending direction of lines of the wiring layer M3 is orthogonal to the extending direction of lines of the wiring layer M2. As shown in FIG. 4, two signal lines 30*a* for the reference signal and three shield lines 31*a* adjacent to the respective signal lines 30*a* are formed in the wiring layer M3. Further, two signal lines 20 for the reference signal and the three shield lines 21 adjacent to the respective signal lines 20 are formed in the wiring layer M2, and this arrangement is common to FIG. 2. In addition, the shield lines 31*a* of the wiring layer M3 and the shield lines 21 of the wiring layer M2 are connected via contact plugs (not shown) in the stacking direction.

In the structure of the modification, sufficient shielding effect can be obtained by the signal lines 20 each functioning as the electrode of the capacitor as in the structure of FIGS. 1 and 2. Thus, when employing the modification, lines for the reference signal can be arranged more densely than the conventional structure.

In the modification, the signal lines 30*a* of the wiring layer M3 may be extended in a horizontal direction of FIG. 4. In this case, the shield lines 21 need to be formed in the lower wiring layer M2 within a range where the signal lines 30*a* are arranged.

Second Embodiment

Figure 5:
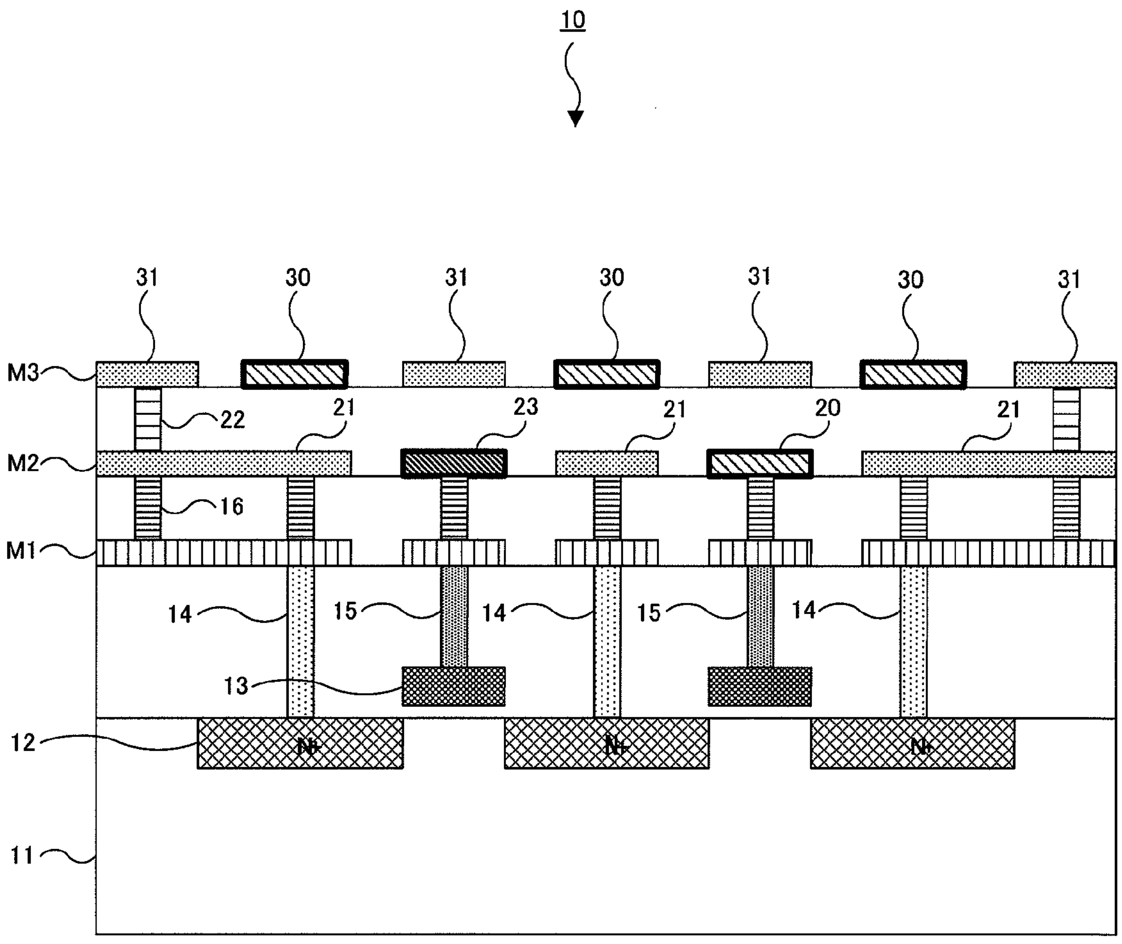
FIG. 5 is a cross-sectional view of a semiconductor device of a second embodiment.

Next, a semiconductor device of a second embodiment of the present invention will be described with reference to FIG. 5. FIG. 5 shows a cross-sectional view of the semiconductor device 10 of the second embodiment. In FIG. 5, elements common to those in the first embodiment are represented by the same numbers and description thereof will be omitted. The second embodiment differs from the first embodiment in that the lower wiring layer M2 is utilized for a purpose other than the signal lines 20 for the reference signal.

In FIG. 5, the signal line 20 for the reference signal is arranged at the right of two positions corresponding to the two signal lines 20 of the wiring layer M2 of FIG. 1, while a power supply line 23 for supplying a supply voltage VCC is arranged at the left of the two positions. This power supply line 23 is used to supply the supply voltage VCC to internal circuit elements of the semiconductor device 10. In addition, the three shield lines 21 formed in the wiring layer M2 are the same as in FIG. 1.

The power supply line 23 of the wiring layer M2 is connected to the gate electrode 13 via the contact plug 16, a line of the wiring layer M1 and the contact plug 15 similarly as the signal line 20. Meanwhile, the shield lines 21 and 31 are connected to the N-type diffusion layers 12 which is fixed to a constant voltage such as the ground potential VSS with the same structure of the first embodiment. Then, a capacitor is formed between each gate electrode 13 connected to the power supply line 23 and the semiconductor substrate 11, which functions as a compensation capacitance for the power supply line 23. That is, the power supply line 23 of the wiring layer M2 can be utilized as a line having both a function as a power supply line supplying the supply voltage VCC and a function as a compensation capacitance stabilizing the potential by suppressing a change in the supply voltage VCC.

Even if the structure of the second embodiment is such that the above power supply line 23 is provided in the wiring layer M2, the shielding effect to shield the signal lines 30 of the upper wiring layer M3 from the noise can be achieved by stabilizing the potential of the power supply line 23. Accordingly, by employing the structure of the second embodiment, the signal lines 20 and 30 for the reference signal and the power supply line 23 can be densely arranged in comparison with the conventional structure.

In FIG. 5, the signal line 20 on the right side of the wiring layer M2 may be replaced with another power supply line 23 in addition to the power supply line 23 on the left side. In this case, the above-mentioned function can be achieved by utilizing two power supply lines 23 of the wiring layer M2. As described above based on the second embodiment, by forming the signal line 20 or the power supply line 23 connected to the gate electrode 13 in the wiring layer M2, the function of supplying the supply voltage having a stable potential can be obtained in addition to the function of transmitting the reference signal.

Third Embodiment

Figure 6:
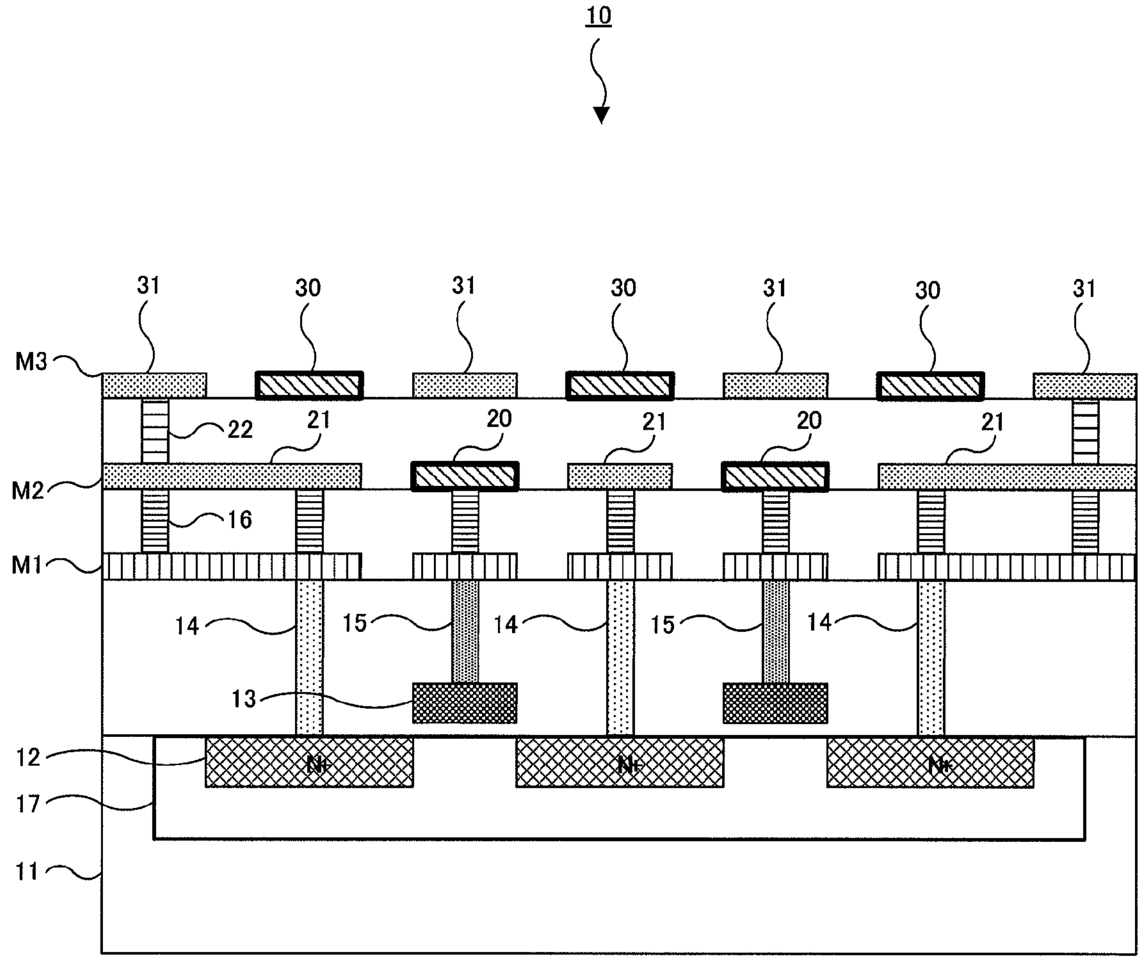
FIG. 6 is a cross-sectional view of a semiconductor device of a third embodiment.

Next, a semiconductor device of a third embodiment of the present invention will be described with reference to FIG. 6. FIG. 6 shows a cross-sectional view of the semiconductor device 10 of the third embodiment. In FIG. 6, elements common to those in the first embodiment are represented by the same numbers and description thereof will be omitted. The third embodiment differs from the first embodiment in terms of a structure of the semiconductor device 10. That is, the semiconductor device 10 of the third embodiment includes an N-type well 17 formed in the P-type substrate 11. The N-type well 17 is previously formed by adding N-type impurity such as phosphorus to an upper portion of the semiconductor substrate 11.

As shown in FIG. 6, the gate electrodes 13 are opposed to a surface of the lower semiconductor substrate 11 within a range where the N-type well 17 is formed. In this case, conductivity type of the semiconductor substrate 11 opposite to the gate electrodes 13 is an N-type. By providing the N-type well 17 in the structure of the third embodiment, the capacitor formed by each gate electrode 13 and the semiconductor substrate 11 is hardly affected by the voltage fluctuation of the semiconductor substrate 11. Further, when a signal of a positive voltage is transmitted through the signal lines 20 of the wiring layer M2, it is possible to prevent the surface layer of the semiconductor substrate 11 from being depleted. Thus, it is possible to effectively prevent the fluctuation of the capacitance value of the capacitor formed by the gate electrode 13 which occurs due to the voltage fluctuation in the signal lines 20.

Since the above-mentioned effect is achieved by employing the third embodiment, the fluctuation in the signal level of the signal lines 20 of the wiring layer M2 can be strongly suppressed, and the shielding effect for the signal lines 30 of the wiring layer M3 can be further improved.

In the foregoing, the present invention has been specifically described based on the first to third embodiments, however the present invention is not limited to the above embodiments, and various modifications can be applied to the present invention without departing from the scope of the present invention. For example, in the above embodiments, the structure in which the three wiring layers M1, M2 and M3 are stacked in the semiconductor device 10 has been described, however the present invention can be applied to a structure having two wiring layers. In this structure, a contact plug for directly connecting each signal line 20 formed in a lower wiring layer and each gate electrode 13 may be provided. Further, the present invention can be applied to a structure having four or more wiring layers. In this structure, each signal line 20 formed in a predetermined wiring layer and each gate electrode 13 may be connected via a plurality of contact plugs arranged in series in the stacking direction. In addition, the connection structure of the signal lines 20 and the gate electrodes 13 is not necessarily formed in a length to cover the entire extension of the signal lines 20, and may be disconnected halfway.

Meanwhile, in the above embodiments, various materials can be used to form the wiring layers M1 to M3, the gate electrodes 13, the contact plugs 14, 15, 16 and 22 without any limitation. One of concrete examples of the materials will be explained below. The wiring layers M1 to M3 can be formed of aluminum (Al) or copper (Cu) and a stacked film containing this material. The contact plugs 14, 15, 16 and 22 can be formed of tungsten (W). The gate electrodes 13 can be formed of polysilicon to which N-type impurity such as phosphorus is added, or a stacked film containing polysilicon and a high-melting point metal film. Further, the present invention is not limited to the semiconductor device 10 having the function described in the embodiments, and can be widely applied to a semiconductor device having a configuration in which a signal required to be stabilized at a predetermined voltage is supplied to circuit elements through wiring layers.

It is apparent that the present invention is not limited to the above embodiments, but may be modified and changed without departing from the scope and spirit of the invention.

What is claimed is:

1. A semiconductor device comprising:

a semiconductor substrate;

a diffusion layer formed on the semiconductor substrate;

at least two wiring layers formed opposite to each other over the semiconductor substrate;

signal lines for transmitting a signal maintaining a predetermined voltage, each of the signal lines being formed in corresponding one of the two wiring layers;

shield lines fixed to a constant voltage to shield the signal lines, each of the shield lines being formed adjacent to at least one of the signal lines in the corresponding one of the two wiring layers; and a gate electrode formed over the semiconductor substrate via an insulation film, wherein at least one of the signal lines formed in a lower wiring layer of the at least two wiring layers is electrically connected to the gate electrode opposed in a stacking direction, wherein the signal lines include a first signal line formed in an upper wiring layer of the at least two wiring layers and a second signal line formed in said lower wiring layer, and the shield lines include a first shield line formed in said upper wiring layer and a second shield line electrically connected to the diffusion layer and formed in said lower wiring layer.

2. The semiconductor device according to claim 1, wherein the first signal line and the first shield line are alternately arranged in the upper wiring layer, and the second signal line and the second shield line are alternately arranged in the lower wiring layer.

3. The semiconductor device according to claim 2, wherein the second shield line is arranged under and opposite to the first signal line and the second signal line is arranged under and opposite to the first shield line.

4. The semiconductor device according to claim 3, wherein an extending direction of the first signal line and the first shield line is orthogonal to an extending direction of the second signal line and the second shield line.

5. The semiconductor device according to claim 1, wherein one or more wiring layers including third signal lines for transmitting a signal different from said signal maintaining the predetermined voltage are stacked under the at least two wiring layers, and the second signal line is electrically connected to the gate electrode via a plurality of contact plugs arranged in series in a stacking direction through the one or more wiring layers.

6. The semiconductor device according to claim 1, wherein a power supply line for supplying a predetermined supply voltage is formed adjacent to the second shield line in the lower wiring layer, and the power supply line is electrically connected to the gate electrode.

7. The semiconductor device according to claim 1, wherein the diffusion layer is formed on an N-type well previously formed on the semiconductor substrate, and the gate electrode and the N-type well are opposed to each other.

8. A semiconductor device comprising:

a semiconductor substrate;

a gate electrode wiring disposed facing to a surface of the semiconductor substrate with an intervention of a gate insulating film therebetween;

a first wiring layer disposed over the gate electrode wiring with an intervention of a first insulating film therebetween;

a second wiring layer disposed facing to an upper surface of the first wiring layer with an intervention of a second insulating film therebetween; and a third wiring layer disposed facing to a side surface of the first wiring layer with an intervention of a part of the second insulating film therebetween, wherein the first wiring layer is a first potential line for supplying a first constant voltage, and the first wiring layer is electrically connected to the gate electrode wiring, and both the second wiring layer and the third wiring layer are shield lines fixed to a second constant voltage.

9. The semiconductor device according to claim 8, further comprising a diffusion layer formed on the semiconductor substrate, wherein the third wiring layer is electrically connected to the diffusion layer.

10. The semiconductor device according to claim 8, further comprising a fourth wiring layer formed at a same level of the second wiring layer, the fourth wiring layer being disposed opposite to a side surface of the second wiring layer, and the fourth wiring layer being disposed facing to an upper surface of the third wiring layer with an intervention of the second insulating film therebetween, wherein the fourth wiring layer is a second potential line for supplying a third constant voltage.

11. The semiconductor device according to claim 10, wherein the first constant voltage and the third constant voltage are same reference voltage, and both the first wiring layer and the fourth wiring layer are reference signal lines for supplying the reference voltage to an internal circuit.

12. The semiconductor device according to claim 8, wherein the first constant voltage is a power supply voltage.

13. The semiconductor device according to claim 8, wherein the second constant voltage is a ground voltage.

14. The semiconductor device according to claim 1, wherein the second shield line formed in said lower wiring layer is arranged opposite to the first signal line formed in the upper wiring layer and the second signal line formed in the lower wiring layer is arranged opposite to the first shield line formed in said upper wiring layer.

15. The semiconductor device according to claim 1, wherein said signal is a reference signal for supplying a reference voltage to an internal circuit.

* * * * *